US012693333B2

(12) United States Patent
Ogawa et al.

(10) Patent No.: US 12,693,333 B2
(45) Date of Patent: Jul. 28, 2026

(54) SPARK DISCHARGE MONITORING SYSTEM AND SPARK DISCHARGE DETECTION DEVICE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kenichirou Ogawa, Yokohama (JP); Shunsuke Ishizaki, Yokohama (JP); Tetsu Shijo, Tokyo (JP); Yasuhiro Kanekiyo, Yokohama (JP)

(73) Assignees: KABUSHIKI KAISHA TOSHIBA, Kawasaki (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 187 days.

(21) Appl. No.: 18/463,055

(22) Filed: Sep. 7, 2023

(65) Prior Publication Data

US 2024/0310443 A1     Sep. 19, 2024

(30) Foreign Application Priority Data

Mar. 13, 2023     (JP) ................................. 2023-038994

(51) Int. Cl.
*G01R 31/34*          (2020.01)
*G08B 21/18*          (2006.01)
(52) U.S. Cl.
CPC ......... *G01R 31/343* (2013.01); *G08B 21/182* (2013.01)
(58) Field of Classification Search
CPC ............ G01R 29/0892; G01R 31/3274; G01R 19/0053; G01R 31/34; G01R 31/346;

G01R 31/12; G01R 19/165; G01R 31/343; G01R 19/25; G01R 19/2509; G01R 31/52; G01R 19/0084; G01R 31/1227; H02K 11/20; H02K 16/00; H02K 11/26; H02K 47/04;

(Continued)

(56) References Cited

U.S. PATENT DOCUMENTS

| | | | | |
|---|---|---|---|---|
| 4,577,151 A | * | 3/1986 | Tanisaka | .............. G01R 31/343 324/102 |
| 7,649,470 B2 | * | 1/2010 | Hobelsberger | ..... G01R 31/1227 324/765.01 |

(Continued)

FOREIGN PATENT DOCUMENTS

| | | |
|---|---|---|
| JP | S5681063 A | 7/1981 |
| JP | S56147382 A | 11/1981 |

(Continued)

OTHER PUBLICATIONS

Australian Examination Report dated Jul. 17, 2024, issued in Australian Application No. 2023226735.

(Continued)

*Primary Examiner* — Vinh P Nguyen
(74) *Attorney, Agent, or Firm* — Holtz, Holtz & Volek PC

(57) ABSTRACT

A spark discharge monitoring system includes a receiving unit, a control unit, and a display unit. The receiving unit receives spark information. The control unit acquires a temporal change of the spark number based on the spark information, corrects the spark number based on operation data including at least a field current, and displays the temporal change of the corrected spark number on the display unit.

20 Claims, 16 Drawing Sheets

(58) Field of Classification Search
CPC ........ H02K 47/14; H02K 23/62; F03D 17/00;
H02N 2/181; G01M 13/00; G08B 2/182;
G08B 21/182
See application file for complete search history.

(56) References Cited

U.S. PATENT DOCUMENTS

| | | | | |
|---|---|---|---|---|
| 8,260,529 | B2 * | 9/2012 | Tanaya | F02P 17/12 |
| | | | | 701/107 |
| 9,037,438 | B2 * | 5/2015 | Cavallini | G01R 31/12 |
| | | | | 702/58 |
| 9,046,579 | B2 * | 6/2015 | Gattermann | G01M 13/04 |
| 12,007,444 | B2 * | 6/2024 | Kanekiyo | G01R 31/343 |
| 2007/0215104 | A1 | 9/2007 | Hahn | |
| 2019/0079118 | A1 | 3/2019 | Yanagita | |
| 2019/0242316 | A1 | 8/2019 | Dudar | |

FOREIGN PATENT DOCUMENTS

| | | | |
|---|---|---|---|
| JP | H01160315 | A | 6/1989 |
| JP | H09140101 | A | 5/1997 |
| JP | 2006166521 | A | 6/2006 |
| JP | 2019054575 | A | 4/2019 |
| JP | 7086325 | B2 | 6/2022 |
| KR | 101861657 | B1 | 5/2018 |
| KR | 20220092181 | A | 7/2022 |
| WO | 2020236154 | A1 | 11/2020 |

OTHER PUBLICATIONS

Japanese Office Action (and an English Inaguage translation thereof) dated Jul. 1, 2025, issued in counterpart Japanese Application No. 2023-038994.

* cited by examiner

SPARK DISCHARGE MONITORING SYSTEM AND SPARK DISCHARGE DETECTION DEVICE

CROSS REFERENCE TO THE RELATED APPLICATIONS

This application is based upon and claims the benefit of priority from the Japanese Patent Application No. 2023-038994, filed on Mar. 13, 2023, the entire contents of which are incorporated herein by reference.

FIELD

Embodiment of the present invention relates to a spark discharge monitoring system and a spark discharge detection device.

BACKGROUND

In a turbine of a power plant, a collector ring is used. The collector ring slides the brush to energize the rotor with a direct current. When a spark is generated between the collector ring and the brush, a high-frequency current flows through the circuit or a fire occurs.

In order to cope with this, a technique for detecting spark discharge between the collector ring and the brush has been widely developed. In the conventional method, there is a case where a spark is evaluated in a case where a single spark is generated, and the frequency of generation of sparks or the like over time is not evaluated. In order to grasp the progress of deterioration of the collector brush, it is necessary to display a temporal change of the spark number on the monitoring screen in real time. In addition, since it is necessary to install a spark detection sensor in the main circuit, it is necessary to stop the generator at the time of installation work.

DETAILED DESCRIPTION

According to an embodiment, a spark discharge monitoring system includes a receiving unit, a control unit, and a display unit. The receiving unit receives spark information. The control unit acquires a temporal change of the spark number based on the spark information, corrects the spark number based on operation data including at least a field current, and displays the temporal change of the corrected spark number on the display unit.

Hereinafter, embodiments will be described with reference to the drawings. In the present disclosure, there are expressions such as "less than" and "equal to or larger than", but these may be appropriately replaced with "equal to or less than" and "larger (higher) than", and the content of the present disclosure is not limited by these expressions.

First Embodiment

Figure 1:
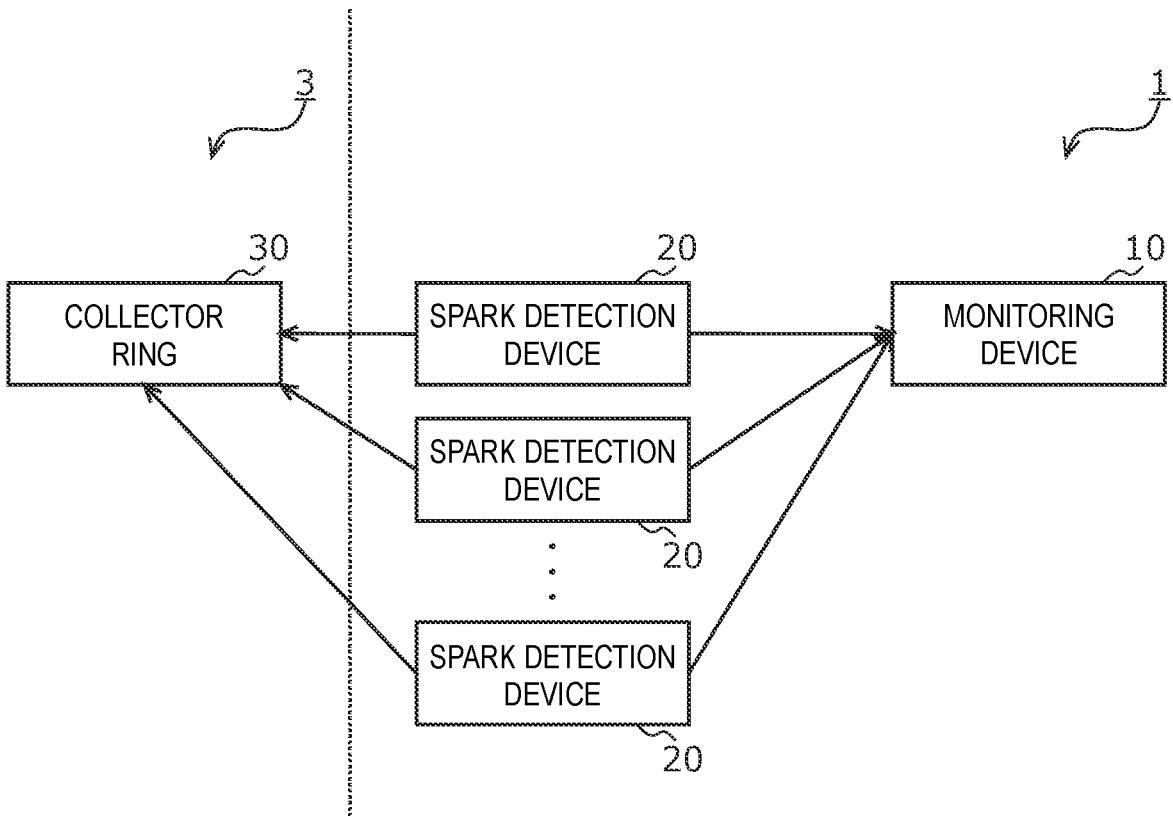
FIG. 1 is a diagram schematically illustrating a spark discharge monitoring system according to an embodiment.

FIG. 1 is a diagram schematically illustrating a spark discharge monitoring system according to an embodiment. A spark discharge monitoring system 1 includes at least a monitoring device 10. The spark discharge monitoring system 1 may further include a spark detection device 20. A plurality of the spark detection devices 20 may be provided for the spark discharge monitoring system 1.

The spark discharge monitoring system 1 is a system that monitors a spark discharge in a collector ring 30 of a power generation system 3.

The power generation system 3 is a system that generates electric current by sliding in the collector ring 30 to generate electric power.

The spark detection device 20 detects that a spark is generated in the sliding portion of the collector ring 30 and transmits the detection result to the monitoring device 10. Transmission of information from the spark detection device 20 to the monitoring device 10 is realized by appropriate means. For example, the spark detection device 20 can transmit information to the monitoring device 10 via a wired or wireless network.

In a case where the plurality of spark detection devices 20 are provided, the plurality of spark detection devices 20 may be arranged to detect sparks at different locations of the collector ring 30, or may be arranged to have different distances or attitudes with respect to the collector ring 30. With this arrangement, the plurality of spark detection devices 20 can accurately detect sparks generated in the same collector ring 30 in different situations.

The monitoring device 10 executes various processing based on the spark information acquired from the spark detection device 20.

Note that, in FIG. 1, the spark detection device 20 is shown as a configuration included in the spark discharge monitoring system 1, but the present invention is not limited thereto. The spark discharge monitoring system 1 may be configured to execute processing based on spark information transmitted from a spark detection device 20 outside the system.

Figure 2:
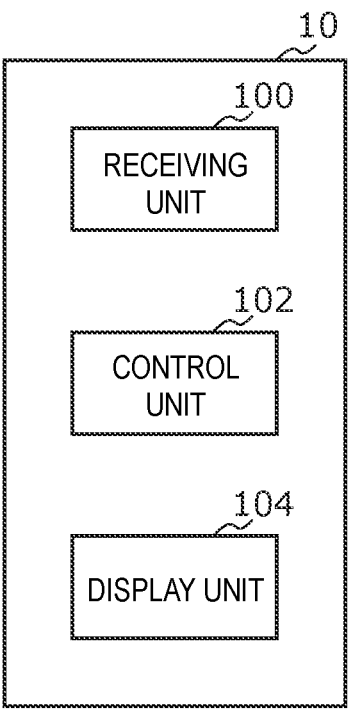
FIG. 2 is a block diagram schematically illustrating an example of a monitoring device according to an embodiment.

FIG. 2 is a block diagram schematically illustrating the monitoring device 10 according to the embodiment. The monitoring device 10 includes a receiving unit 100, a control unit 102, and a display unit 104. Although not illustrated, the monitoring device 10 further includes other components such as a storage unit necessary for the operation of the monitoring device 10 as appropriate.

The receiving unit 100 acquires the spark information detected by the spark detection device 20 from the spark detection device 20. The receiving unit 100 outputs the acquired spark information to the control unit 102.

The control unit 102 performs appropriate control based on the spark information. The control unit 102 may be, for example, a general-purpose processing circuit (processor), an application specific integrated circuit (ASIC), or the like. Any of the processing circuits may include a digital or analog circuit in a part thereof.

In a case where the control unit 102 includes a general-purpose processing circuit, at least a part of the processing may be in a mode in which information processing by software is specifically realized by a processor that is a hardware resource. An execution file, a program, and the like related to software may be stored in a storage unit (not illustrated), and information processing by software may be realized by the control unit 102 referring to the execution file and the like.

The control unit 102 may calculate a spark number from the spark information acquired via the receiving unit 100. In this case, the spark number is not limited to an integer, and may be a value including a decimal. In addition, the receiving unit 100 may acquire spark information including the spark number in a state where the spark number is calculated in the spark detection device 20, and the control unit 102 may extract the spark number from the spark information. Also in this case, the spark number is not limited to an integer, and may be a value including a decimal.

The display unit 104 transmits information to the user by performing appropriate display based on the signal received from the control unit 102. The display unit 104 may be, for example, a device such as a display or a display with a touch panel. Furthermore, the device that outputs information to the user may not be the display unit 104, but may be a device that outputs sound such as a speaker or a device having another output form such as a device that outputs information by vibration.

The display unit 104 is not provided inside the monitoring device 10, but may be an independent device provided outside the monitoring device 10 and connected to the monitoring device 10 via an appropriate interface.

Figure 3:
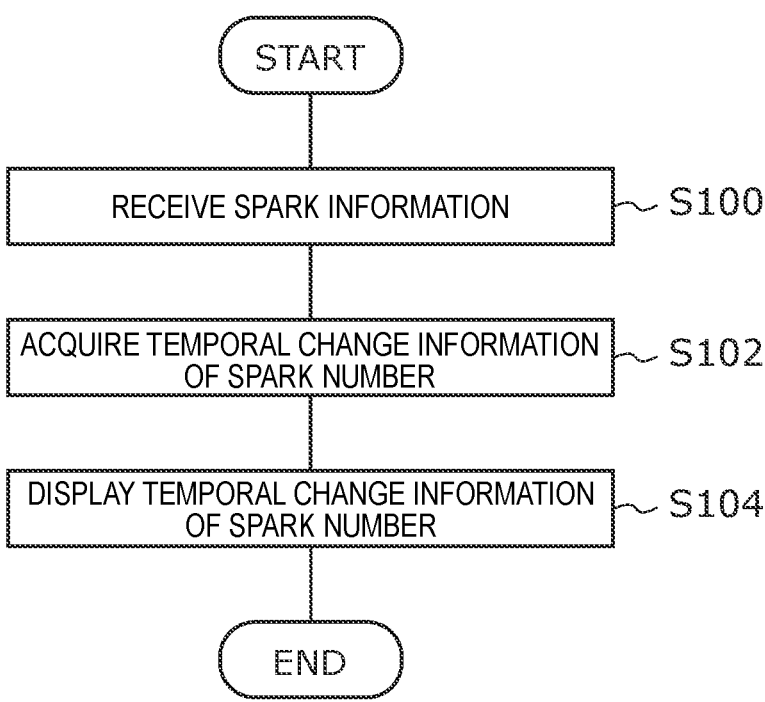
FIG. 3 is a flowchart illustrating an example of processing of the monitoring device according to the embodiment.

FIG. 3 is a flowchart illustrating an example of processing of the monitoring device according to the embodiment. A flow of basic processing in the present disclosure will be described with reference to this flowchart.

The receiving unit 100 receives the spark information from the spark detection device 20 (S100). The spark information is information on a spark caused by sliding between the collector ring 30 and the brush acquired by the spark detection device 20. The spark information is, for example, information directly or indirectly obtained from the current generated by the spark.

The control unit 102 acquires the spark number from the spark information received by the receiving unit 100, and acquires information on the temporal change of the spark number (S102). In a case where the spark information includes information on the spark number, the control unit 102 extracts the spark number from the spark information and acquires time-series data of the spark number.

In a case where the spark information does not directly include information on the spark number, the control unit 102 can also calculate the spark number from the spark information by a predetermined calculation.

The control unit 102 can store data of the spark number in the storage unit as necessary. The control unit 102 can acquire the information on the temporal change of the spark number based on the real-time spark information received by the receiving unit 100 and the data of the spark number stored in the storage unit and acquired in the past.

The control unit 102 displays the acquired information on the temporal change of the spark number on the display unit 104 (S104). For example, the control unit 102 can perform control to graph information on the temporal change of the spark number and display the information on the display unit 104.

Figure 4:
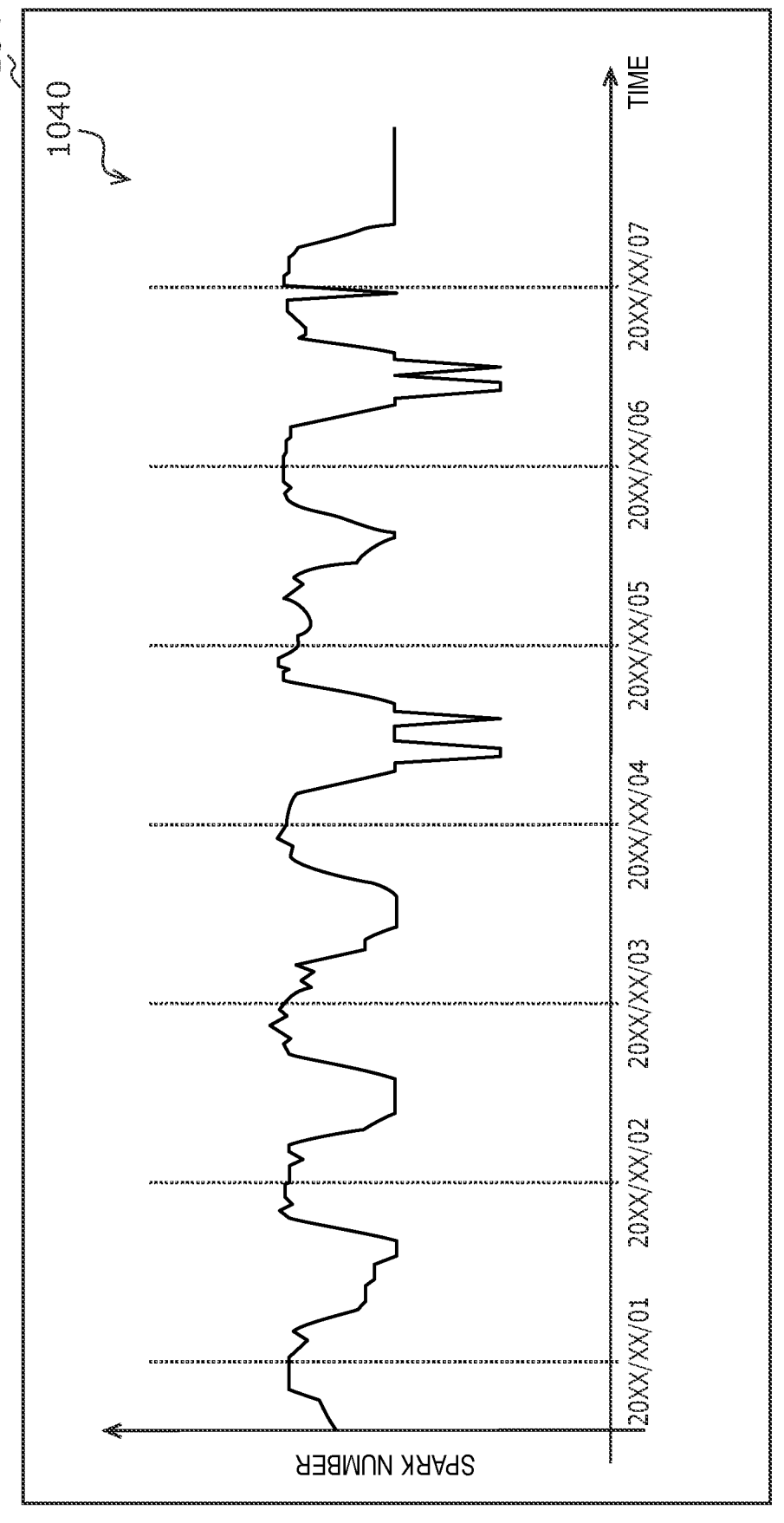
FIG. 4 is a diagram illustrating an example of display of a temporal change of spark information according to an embodiment.

FIG. 4 is a diagram illustrating an example of a temporal change of the spark number displayed on the display unit 104 according to the embodiment. The control unit 102 creates a graph (trend map) of the temporal change of the spark number to be displayed on the display unit 104, and displays the trend map in a graph display area 1040 of the display unit 104.

As an example, the trend map is a graph showing time on the horizontal axis and the spark number on the vertical axis. In the example of FIG. 4, transition data of the spark number for the past week from the referred time is displayed as a trend map. One week is given as a non-limiting example, and the range displayed as the trend map is not limited thereto.

The spark number indicated in the trend map includes, as an example, information on the spark number per unit time (maximum value of the spark number measured in one minute). The spark number may be information included in the spark information transmitted by the spark detection device 20 as described above.

The spark information may further include information such as a time, an identifier of the spark detection device 20 (when there are a plurality of spark detection devices 20), a maximum value of the spark number per unit time, a duration of the spark number, error information of the spark discharge detection device, a temperature of the spark discharge detection device, and an air temperature and/or a humidity of a place where the spark discharge detection device is installed.

In Japan, the spark number is defined as 1 to 8 in the standard of JEC 54. In this standard, a case where the spark number is five or more is regarded as a harmful spark, and a case where the spark number is four or less is regarded as harmless. In the present disclosure, the spark number is not limited to this range, and a larger number such as No. 10 or No. 20 may be defined.

From the definition of the number, for example, the control unit 102 may provide a threshold between No. 4 and No. 5 in the trend map, and display an index such as a line indicating the threshold in a medium number such as No. 4.5 in a superimposed manner.

By displaying the temporal change of the spark number in this manner, it is possible to monitor the deterioration state of the brush of the collector ring. In the collector ring, a single spark may be suddenly generated depending on an operation situation. By displaying the temporal change as in the present embodiment, it is possible to determine whether it is the generation of such a single spark or a spark continuously generated due to deterioration of the collector ring.

Second Embodiment

In the following embodiment, various processing based on the configuration described in the first embodiment will be described. In the present embodiment, the spark discharge monitoring system 1 outputs not only the spark number but also operation data of a generator having some correlation with the spark number.

Figure 5:
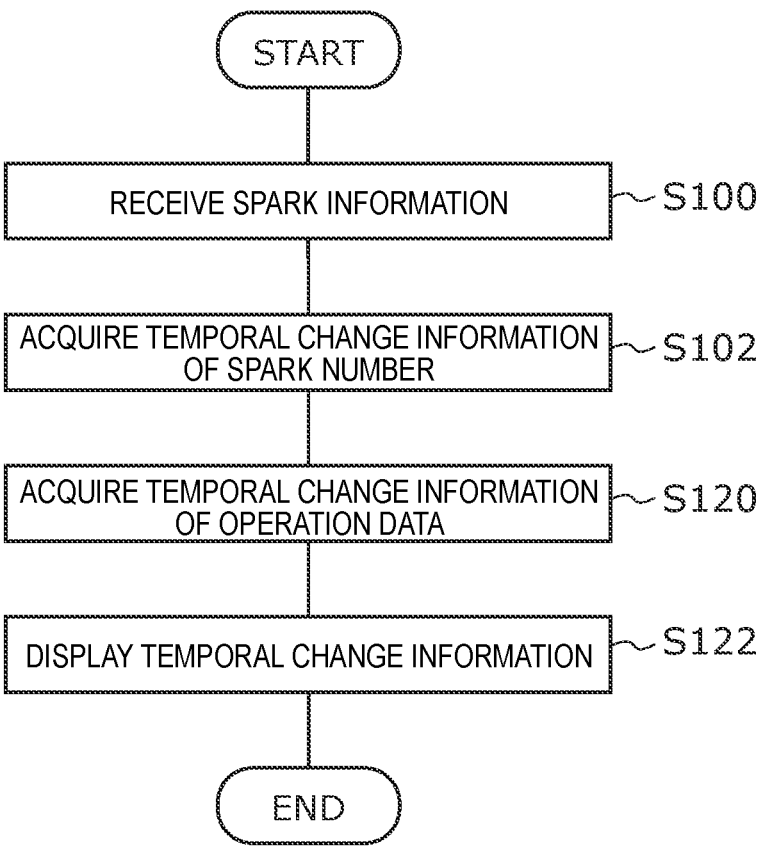
FIG. 5 is a flowchart illustrating an example of processing of the monitoring device according to the embodiment.

FIG. 5 is a flowchart illustrating an example of processing of the monitoring device according to the embodiment. Processing denoted by the same reference numeral as that in FIG. 3 is similar to that in the above-described embodiment, and thus detailed description thereof will be omitted.

The receiving unit 100 receives the spark information from the spark detection device 20 (S100), and the control unit 102 acquires temporal change information of the spark number based on the received spark information (S102).

The control unit 102 acquires temporal change information of the operation data (S120). The operation data may be transmitted together with the spark information from the spark detection device 20, or may be transmitted from a control device, a sensor, or the like included in the power generation system through another path and acquired via the receiving unit 100.

As an example, the control unit 102 may acquire operation data including at least data on a field current, and acquire temporal change information on the field current. The field current is given as a non-limiting example, and the following processing may be executed using other operation data correlated with the generation of sparks.

The control unit 102 displays the temporal change of the operation data on the display unit 104 together with the temporal change of the spark number or superimposed on the temporal change of the spark number (S122).

Figure 6:
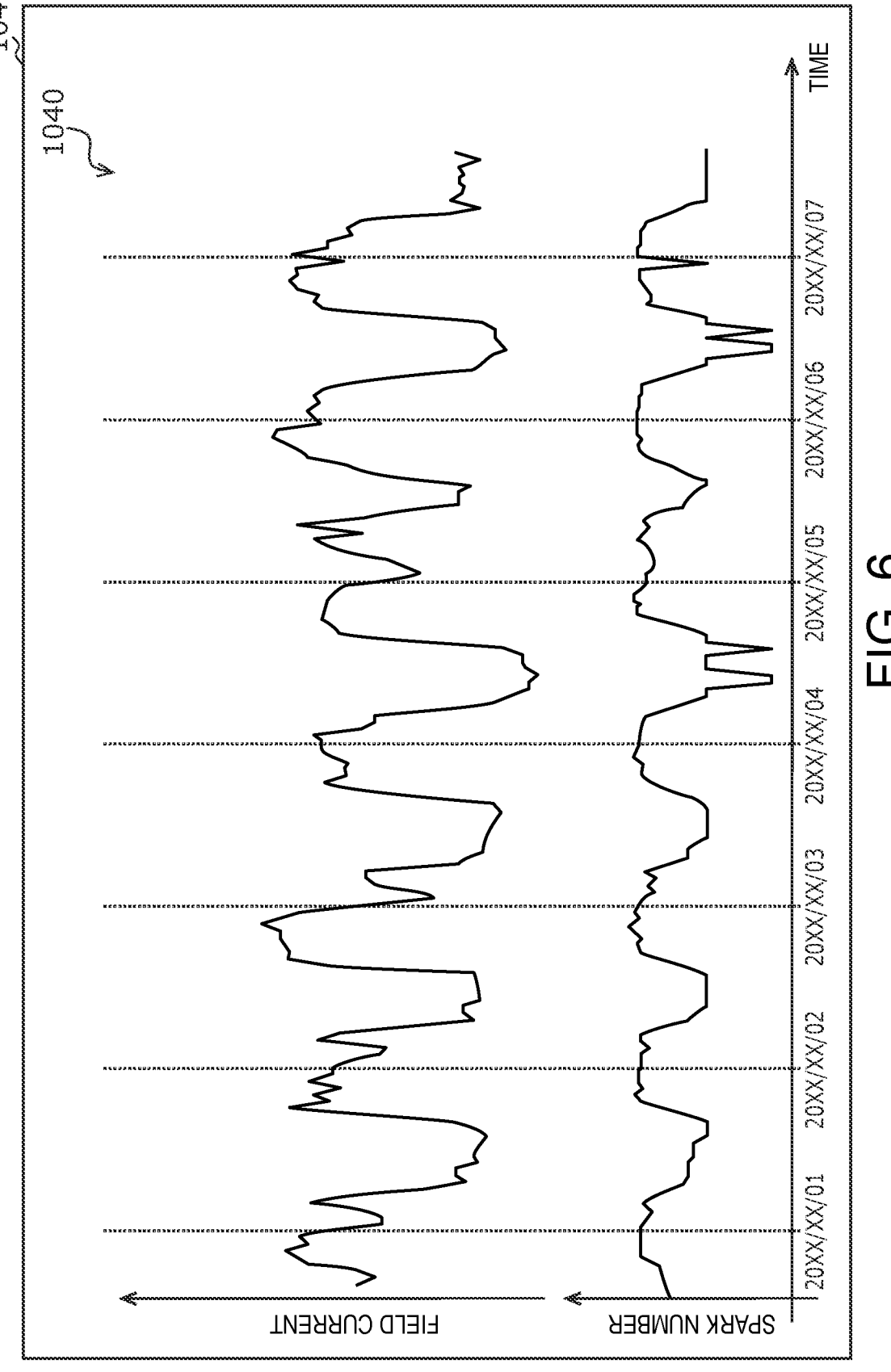
FIGS. 6 and 7 are diagrams illustrating an example of display of a temporal change of spark information according to an embodiment.

FIG. 6 is a diagram illustrating an example of display of a temporal change of spark information according to an embodiment. For example, the spark discharge monitoring system 1 can display temporal change information of a field current as an example of operation data on the upper part, and can also display temporal change information of the spark number on the same time axis.

Figure 7:
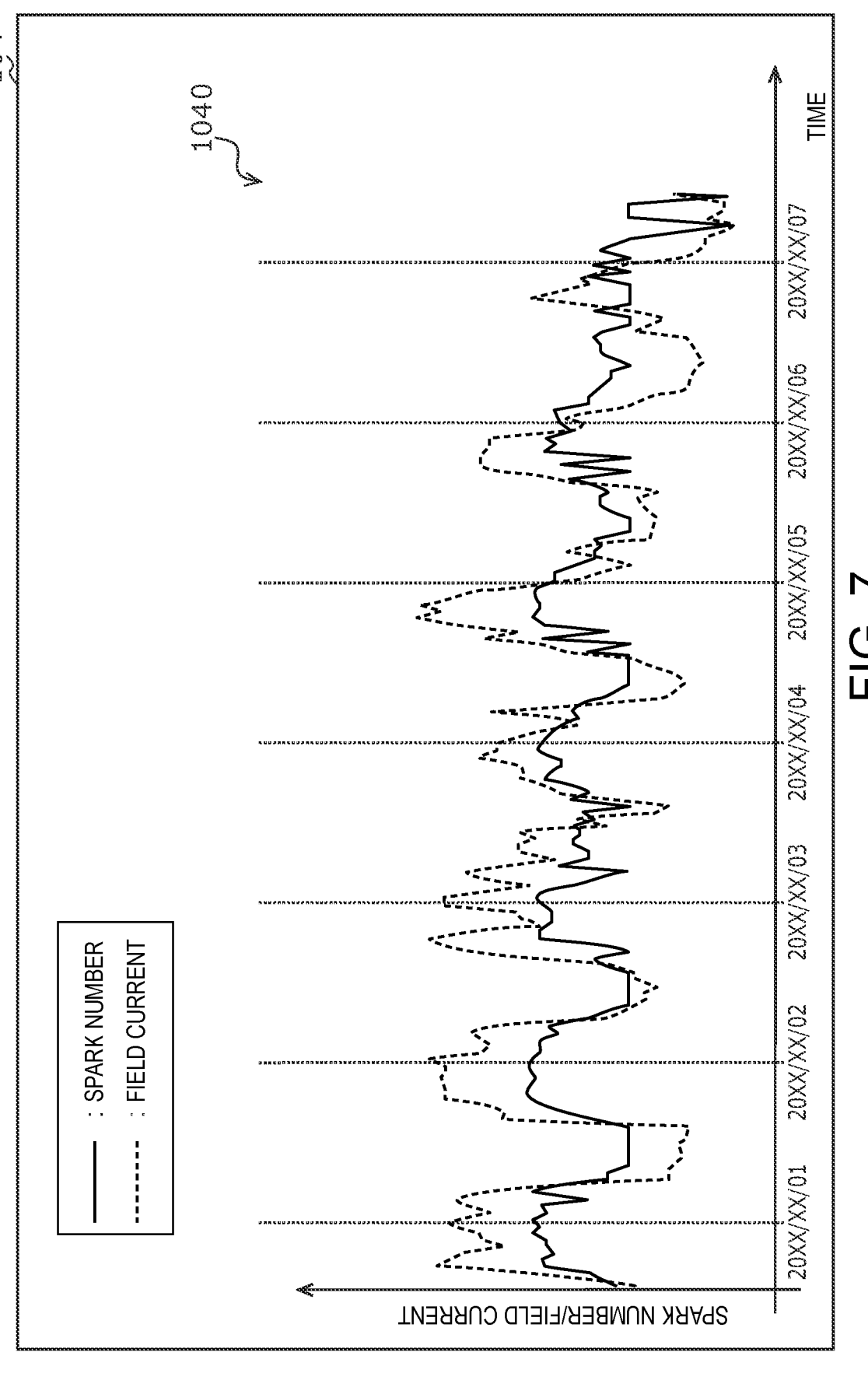

FIG. 7 is a diagram illustrating an example of display of a temporal change of spark information according to an embodiment. The spark discharge monitoring system 1 can display, for example, temporal change information of a field current as an example of operation data in a superimposed manner on temporal change information of the spark number.

In any case, as in the above-described embodiment, it is possible to provide a threshold for the spark number and to further superimpose a line or the like based on the threshold.

Although the field current is illustrated in the drawing, other operation data may be used as described above. Furthermore, the operation data to be displayed may be specified by a request from the user. The operation data to be displayed is not limited to one piece of operation data, and a plurality of pieces of operation data may be displayed.

In addition, in the drawing, the temporal change of the operation data is displayed as a graph, but the present invention is not limited thereto. For example, the control unit 102 can further display real-time (current) operation data as character data or numerical data on the display unit 104.

As described above, according to the present embodiment, together with the spark number, at least one of the operation data can be displayed as another graph or as a superimposed graph. By displaying the temporal change of at least one of the operation data together with the temporal change of the spark number in this manner, the state of the generator can be easily checked.

Third Embodiment

In the second embodiment, the field current is also displayed as an example, but the spark discharge monitoring system 1 may be configured to correct the spark number using data of the field current. Furthermore, the spark discharge monitoring system 1 may be configured to display a temporal change of the corrected spark number.

Figure 8:
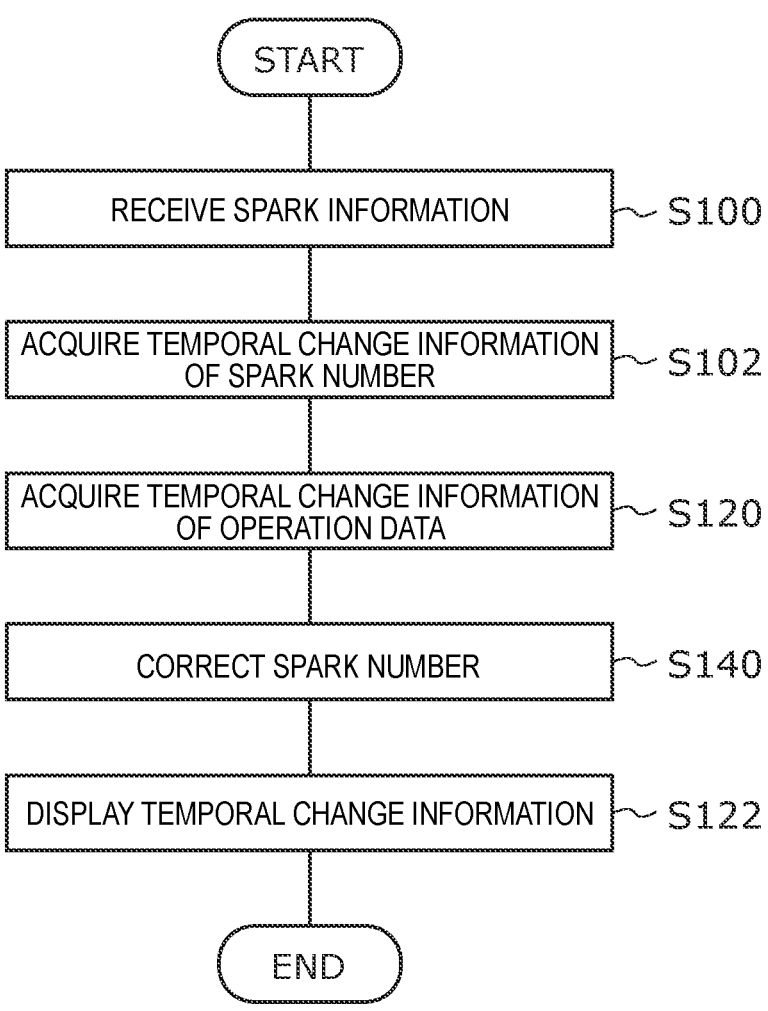
FIG. 8 is a flowchart illustrating an example of processing of the monitoring device according to the embodiment.

FIG. 8 is a flowchart illustrating an example of processing of the monitoring device 10 according to the embodiment. Hereinafter, the field current is used as the operation data, but other operation data correlated with the spark number can be used for correction.

After acquiring the temporal change information of the operation data (S120), the control unit 102 corrects the temporal change information of the spark number based on the temporal change information of the operation data (S140).

For example, the control unit 102 can perform correction such that the larger the field current, the smaller the spark number based on the following equation.

$$\text{(Corrected spark number)} = \tag{1}$$
$$\text{(Spark number)} \times \frac{\text{(Field current correction coefficeient)}}{\text{(Field current measured value)}}$$

The corrected spark number is the corrected spark number. The field current correction coefficient is a constant indicating a weight on the spark number from the measured value of the field current. The control unit 102 can acquire the time series data of the corrected spark number, that is, the temporal change information of the corrected spark number by substituting the time series data of the acquired temporal change information of the spark number and the temporal change information of the field current into formula (1).

The control unit 102 can perform control to display, as the temporal change information, for example, a temporal change of the spark number, a temporal change of the field current, and a temporal change of the corrected spark number on the display unit 104 (S122).

Figure 9:
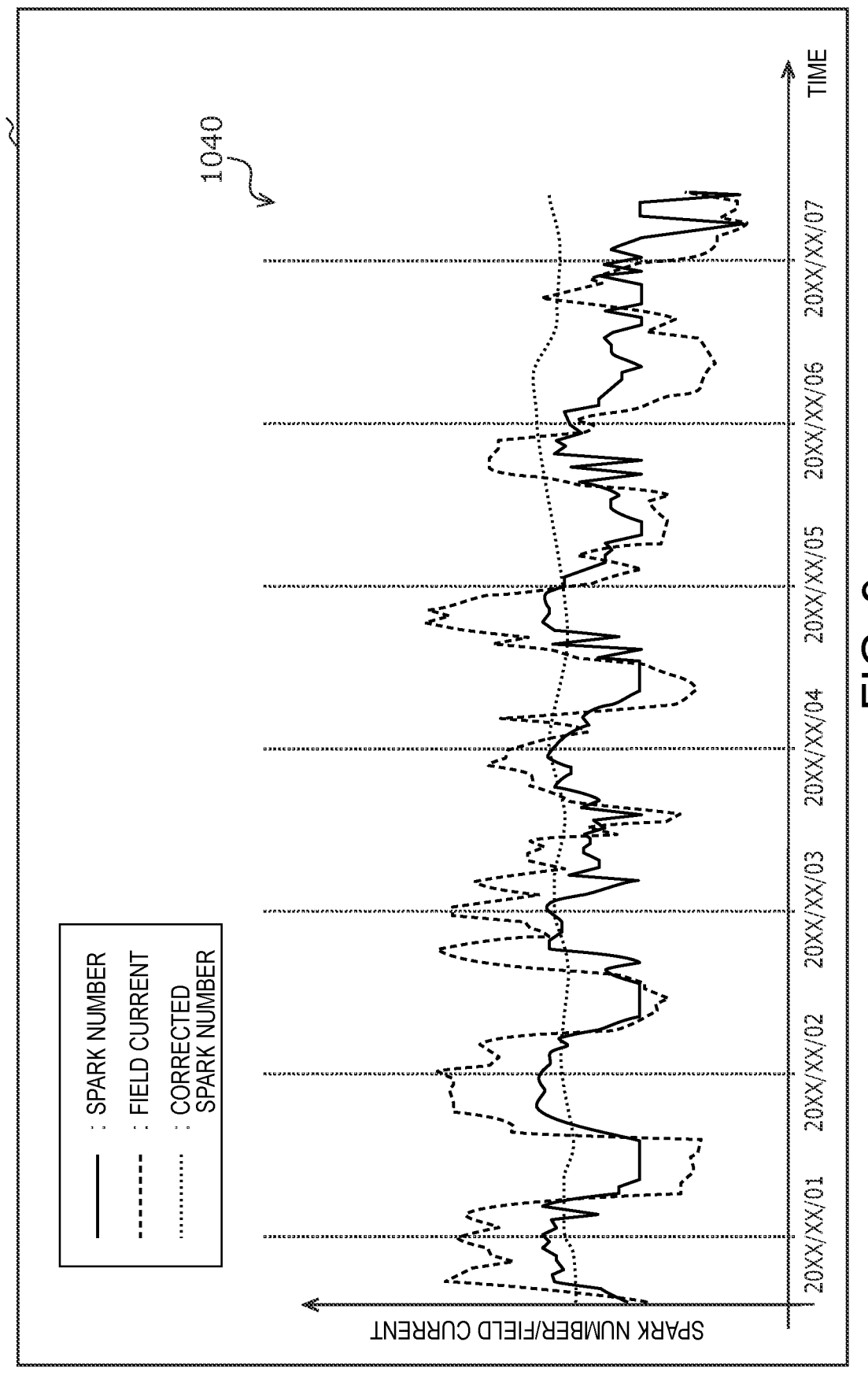
FIG. 9 is a diagram illustrating an example of display of a temporal change of spark information according to an embodiment.

FIG. 9 is a diagram illustrating an example of display of a temporal change of spark information according to an embodiment. The solid line represents a temporal change of the spark number, the broken line represents a temporal change of the field current, and the dotted line represents a temporal change of the corrected spark number. The control unit 102 can display these temporal changes with differences such as a line type, a line thickness, and a line color. Of course, the monitoring device 10 can also display the corrected spark number and the thresholds for the spark number in a superimposed manner as in the above-described embodiment.

For example, the control unit 102 can superimpose a temporal change of the spark number based on the spark information, a temporal change of the operation data including at least the field current, and a temporal change of the corrected spark number on the display unit 104 to display as a trend map.

With this display, the user can confirm the corrected spark number proportional to the field current even when the collector ring 30 is in the same deterioration state.

As can be seen from FIG. 9, there is a strong correlation between the field current and the spark number, and the time transition is close to proportional. Therefore, it is preferable that the corrected spark number is a value close to a predetermined value based on the field current correction coefficient. For example, as the deterioration of the device such as the collector ring 30 progresses, the spark number with respect to the field current changes.

Therefore, the control unit 102 can realize control based on deterioration of the generator side device by issuing an alarm when the corrected spark number largely deviates from the predetermined value, for example, when the difference from the predetermined value is larger than the predetermined deviation value.

As described above, according to the present embodiment, it is possible to correct the spark number based on the operation data, and it is also possible to prompt the user to perform control based on the corrected spark number. When the correlation between the field current and the spark number is largely deviated, the deviation of the corrected spark number from the predetermined value becomes large. Therefore, by using the corrected spark number, the spark discharge monitoring system 1 can realize control in a state in which deterioration or the like of the device is more easily detected, or can promote the control.

The control unit 102 can also output an index based on the spark number and the operation output (field current) instead of the corrected spark number.

$$(\text{Slope of graph}) = \frac{(\text{Spark number})}{(\text{Field current measured value})} \quad (2)$$

The control unit 102 can also calculate the slope of the graph represented by formula (2) and display the slope together with the spark number. When the collector ring 30 is not deteriorated or is hardly deteriorated, the slope of the graph represented by the formula (2) is substantially constant. As a result, by acquiring and displaying the slope of the graph, the same effect as described above can be obtained.

In addition, the control unit 102 may acquire data such as temperature and humidity of the environment in which the collector ring 30 is provided, and reflect the data of temperature and humidity in the correction of the spark number.

$$(\text{Corrected spark number}) = \quad (3)$$
$$(\text{Spark number}) \times \frac{(\text{Field current correction coefficeient})}{(\text{Field current measured value})} \times$$
$$\frac{(\text{Humidity measured value})}{(\text{Humidity correction coefficient})}$$

The humidity correction coefficient (first correction coefficient) is a constant indicating a decrease in the spark number with respect to humidity. In general, the higher the humidity is, the less the spark discharge is generated, and the influence of the spark discharge on the humidity is high. Therefore, the control unit 102 can correct the spark number at which the influence of humidity is suppressed by calculating the corrected spark number by formula (3). As a result, it is possible to construct a monitoring system capable of more accurately detecting a failure or the like of the generator.

Note that, as described above, the control unit 102 can also correct the spark number based on not only the humidity but also a formula reflecting the temperature in the correction.

In the present embodiment, in addition to the values calculated by the formulas (1) to (3), the control unit 102 may calculate a correlation value between the spark number and the field current instead of the values calculated by these formulas.

Fourth Embodiment

In the embodiment described above, the spark number is corrected using operation data such as a field current. In the present embodiment, the spark discharge monitoring system 1 predicts the spark number of a spark to be generated in the future by using operation data correlated with the spark number such as a field current.

Figure 10:
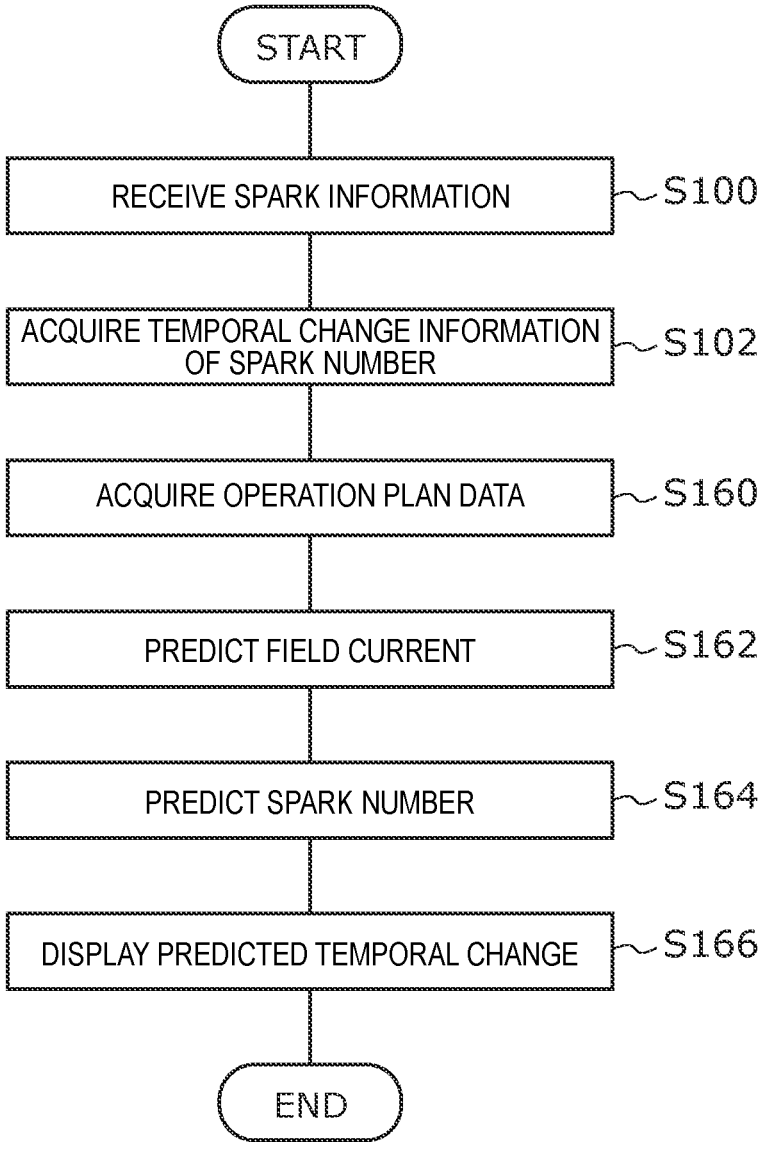
FIG. 10 is a flowchart illustrating an example of processing of the monitoring device according to the embodiment.

FIG. 10 is a flowchart illustrating an example of processing of the monitoring device according to the embodiment. Although the processing of S100 and S102 is illustrated in this flowchart, these processing are not necessarily required. In a case where the control unit 102 can use the relational expression between the operation data (for example, field current) derived from the operation plan data and the spark number, or the like, these processing can be omitted and the processing can be started from the processing of S160.

The control unit 102 acquires the operation plan data (S160). The control unit 102 acquires the operation plan data based on, for example, conventionally used data or electric power market transaction data.

For example, the control unit 102 can predict an amount of power to be generated from the price in each time unit with reference to the price in the electric power spot market (the value acquired by the single price auction), and predict and acquire the operation plan data from the amount of power.

When the acquired data includes the data of the predicted power plant output, the control unit 102 can acquire the data of the predicted power plant output as the operation plan data.

The control unit 102 predicts a field current based on the acquired operation plan data (S162). Instead of the field current, other operation data correlated with the spark number may be acquired. For example, the control unit 102 predicts a temporal change of a field current, that is, a future field current, for each time unit in the spot market.

The control unit 102 predicts a temporal change of the future spark number from the predicted future temporal change of the field current (S164). Since there is a correlation between the field current and the spark number as described above, the spark number can be predicted from the field current. This relational expression can also be acquired in advance by past results or the like.

As described above, according to the present embodiment, it is possible to predict the future spark number, and it is possible to make a maintenance plan or the like based on the prediction of the spark number.

Note that, the present embodiment can also be used in combination with the third embodiment described above. For example, the monitoring device 10 may display a prediction curve of the future temporal change calculated in the present embodiment so as to be continuous with the temporal change based on the actually measured value up to the present (the current day).

In this case, it is also possible to display a prediction curve before the present predicted in the past to be superimposed on a curve based on the actually measured value. With such display, it is also possible to monitor the difference between the actual value and the predicted value. The control unit 102 can also correct coefficients and the like of the respective formulas described above based on the acquired difference.

Fifth Embodiment

The spark discharge monitoring system 1 may be configured to output an alarm from a display unit or an output unit such as a speaker when an abnormality has occurred or when an abnormality is about to occur. In this case, a user can set or change a threshold or the like for outputting an alarm.

Figure 11:
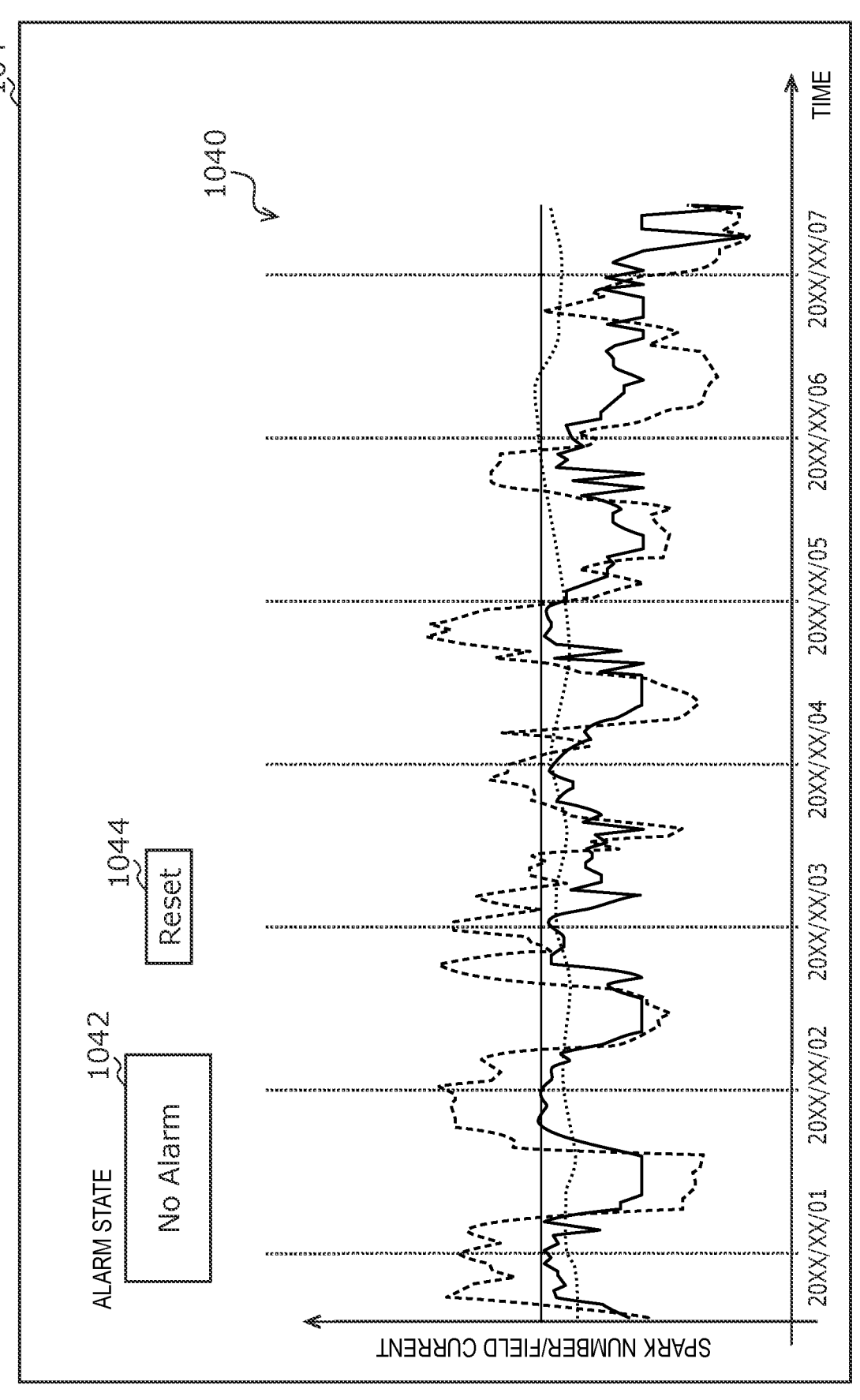
FIGS. 11 to 15 are diagrams illustrating an example of display on the display unit according to an embodiment.

FIG. 11 is a diagram illustrating an example of display on the display unit according to an embodiment. The display unit 104 may include an alarm display area 1042 indicating an alarm state and a reset button 1044. The reset button 1044 is not an essential configuration and may not be arranged.

The alarm display area 1042 may display an alarm. The control unit 102 can execute processing of displaying an alarm on the display unit 104 based on the spark number or the corrected spark number.

For example, when the spark number is less than the first threshold, the control unit 102 displays first information ("No Alarm") indicating that there is no alarm in the alarm display area 1042 of the display unit 104.

For example, when the spark number is equal to or larger than the first threshold, the control unit 102 determines that some trouble has occurred and displays second information ("Alarm") indicating that an alarm is present in the alarm display area 1042 of the display unit 104.

As illustrated in the drawing, the first threshold may be displayed in the graph display area 1040 in a manner superimposed with a temporal change. For example, the first threshold may be an integer value such as 5 or a fractional value such as 4.5.

Alternatively, the determination may be made not by the spark number but by the corrected spark number. Although the spark number will be described below, it can be appropriately replaced with the corrected spark number.

The monitoring device 10 can also include an input unit, and may be configured to delete an alarm by pressing the reset button 1044 of the display unit 104 via the input unit in a state where the alarm is displayed. The input unit may be an interface such as a mouse, a keyboard, a trackball, or a touch panel.

The second information may be latched and displayed until the reset button 1044 is operated.

In addition, the monitoring device 10 may be configured to determine the alarm state by using a second threshold and a third threshold larger than the second threshold.

In this mode, the control unit 102 displays the first information in the alarm display area 1042 when the spark number is less than the second threshold. The control unit 102 displays third information ("Caution") in the alarm display area 1042 when the spark number is equal to or larger than the second threshold and less than the third threshold. The control unit 102 displays the second information in the alarm display area 1042 when the spark number is equal to or larger than the third threshold.

The third information is information indicating a stage before an alarm is issued, and for example, is a stage of calling attention to the user that there is a possibility that an abnormality has occurred or there is a possibility that an abnormality will occur in the near future. On the other hand, the second information is information indicating a stage of issuing an alarm, and may be information for transmitting a warning that an action is necessary to the user.

After the second information or the third information is displayed, these pieces of information may be latched and displayed. Similarly to the above, even in the case of three stages, the display of the alarm display area 1042 can transition to the first information by operating the reset button 1044 for the display.

As a non-limiting example, the second threshold may be two, and the third threshold may be five. In this case, when the spark number is less than two, the first information is displayed without an alarm, when the spark number is two or more and less than five, the third information is displayed, and when the spark number is five or more, the second information is displayed on the display unit 104.

Figure 12:
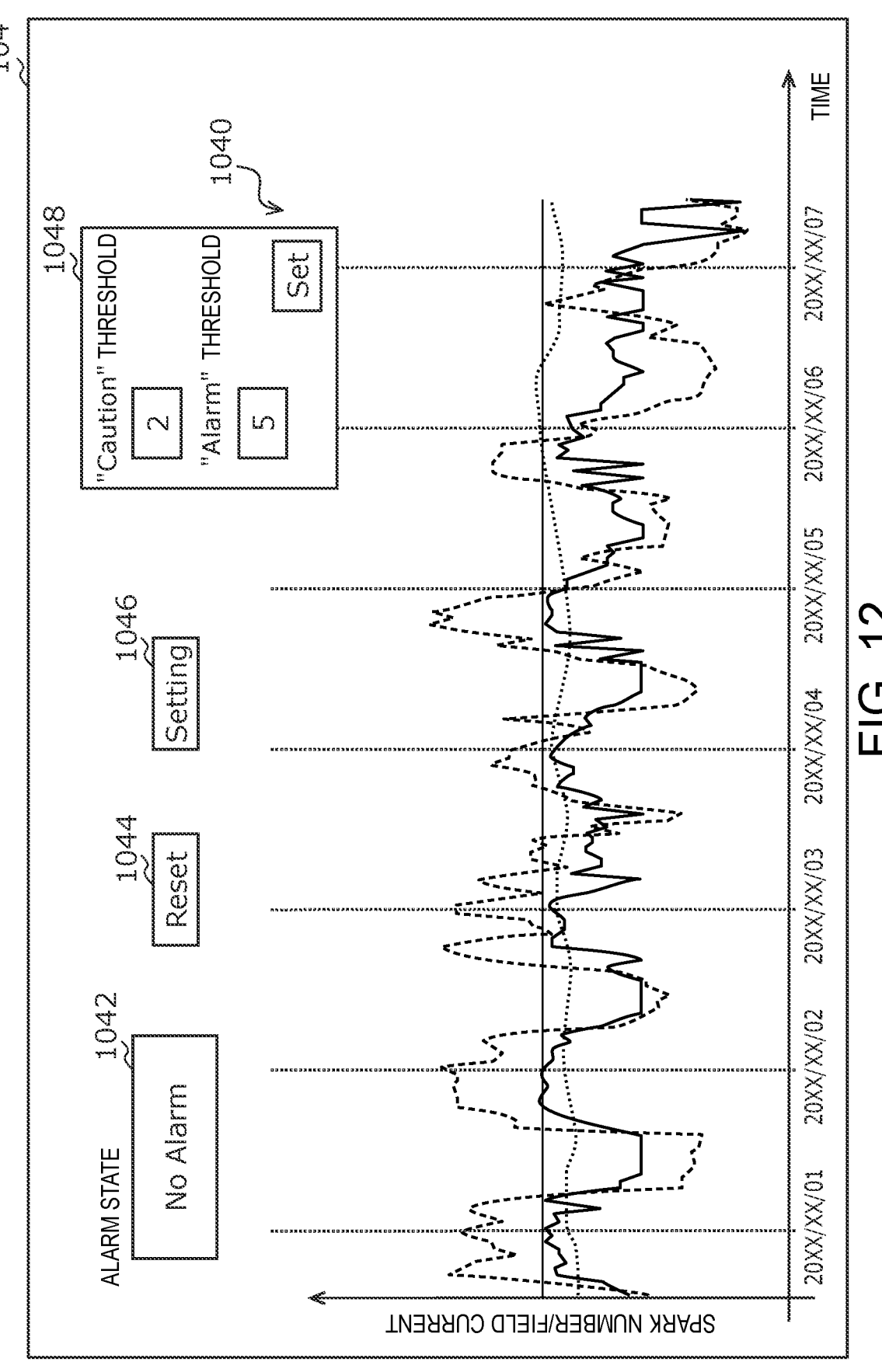

FIG. 12 is a diagram illustrating another aspect of the form. The monitoring device 10 may be configured to be able to change a threshold for outputting the above information in response to a request from a user. For example, a setting button 1046 is further arranged on the display unit 104.

When the setting button 1046 is pressed, a setting area 1048 which is a threshold setting area is developed. The user can set a threshold for displaying the second information or the third information in the setting area 1048. When the threshold is changed, the control unit 102 determines the subsequent alarms based on the changed threshold.

Note that, the development of the setting area 1048 is illustrated as an example, and the present invention is not limited to this aspect. For example, an aspect may be employed in which an area to which a threshold can be input at all times is displayed, and the threshold can be changed by setting the threshold in this area and pressing the setting button 1046.

As described above, according to the present embodiment, the spark discharge monitoring system 1 can present, to the user, information indicating that there is no abnormality, an abnormality has occurred, there is a possibility that an abnormality has occurred, or there is a possibility that an abnormality will occur in the near future. In a case where an alarm is issued, the user can confirm the alarm and then delete the alarm or change the threshold for displaying the alarm.

Note that, in the above description, the monitoring device 10 generates the alarm (displays the second information or the third information) even when a single spark is generated, but the present invention is not limited thereto.

For example, the control unit 102 may display the second information in a case where the spark number equal to or larger than the first threshold is continuously generated for the number of times equal to or larger than the fourth threshold.

In the mode of displaying the third information, the control unit 102 may display the second information or the third information on the display unit 104, for example, when the spark number equal to or larger than the second threshold is continuously generated for the number of times equal to or larger than the fourth threshold. As another example, the control unit 102 may display the second information on the display unit 104 in the same manner as described above with respect to the display of the third information when the spark number equal to or larger than the third threshold is continuously generated for the number of times equal to or larger than the fourth threshold.

By determining that the spark number continuously exceeding the threshold is generated in this manner, it is possible to display the alarm only in a case where sparks of the spark number equal to or larger than a predetermined value are continuously generated, instead of displaying the alarm each time for a spark generated in a single event. By not displaying an alarm for a single spark that can be noise in this manner, it is possible to avoid frequent occurrence of alarms particularly in a case where there is no abnormality.

Sixth Embodiment

As illustrated in FIG. 1, the monitoring device 10 can acquire spark information from a plurality of spark detection devices 20. In the present embodiment, details of the processing in the case of using the information from the plurality of spark detection devices 20 will be described.

When the spark information is acquired from the plurality of spark detection devices 20, the control unit 102 can extract a maximum value from a plurality of spark numbers included in the spark information or a plurality of spark numbers that can be calculated from the plurality of pieces of spark information, and execute the processing according to each of the above-described embodiments. The plurality of spark detection devices 20 may acquire spark information at the same timing and transmit the spark information to the monitoring device 10.

For example, the control unit 102 acquires the spark information from the plurality of spark detection devices 20 in S100 in FIG. 3, extracts the maximum value of the plurality of spark numbers between S100 and S102, and acquires the temporal change information based on the maximum value extracted in S102. The control unit 102 can similarly read the past spark numbers from the data in which the spark number from which the maximum value has been extracted is stored. Also in the flowchart of another embodiment, the control unit 102 can similarly perform processing based on spark information from the plurality of spark detection devices 20.

Note that, as described above, the spark number may be a value including a decimal, and in this case, the control unit 102 can acquire the spark number with high accuracy in a finer unit.

In addition, the unit time for extracting the spark number displayed on the display unit 104 can be changed. For example, in each of the above-described embodiments, a value measured for each unit time can be used, or a maximum value of the spark number measured for each unit time can be used.

As a non-limiting example, the unit time may be 30 minutes, and the spark detection device 20 may acquire and transmit spark information to the monitoring device 10 every 30 minutes. As another non-limiting example, the unit time may be set to 30 minutes, and the control unit 102 may extract a maximum value from the spark numbers acquired during 30 minutes to set the spark number within the unit time.

For example, in a case where the data of the spark number is acquired every one minute, when the spark numbers for one year are displayed, enormous data of 60 [minutes/hour]× 24 [hours/day]×365 [days]=525,600 points is displayed on the display unit 104. Here, when the maximum value from 60 pieces of data for one hour is extracted, this number can be reduced to 8,760.

When receiving information from the plurality of spark detection devices 20, the control unit 102 can also extract a maximum value of the spark numbers acquired by the plurality of spark detection devices 20 within a unit time.

As described above, according to the present embodiment, by adopting the value of the spark number in the most deteriorated state detected by the plurality of spark detection devices 20, it is possible to reduce the possibility of occurrence of abnormality or overlooking the possibility of occurrence of abnormality. In addition, in a case where data in a long range is viewed on the monitoring screen, it is possible to prevent the number of data from being too large and the operation from becoming heavy. By reducing the number of points to be displayed, the operation of the monitoring screen can be made smooth, and usability can be improved.

Seventh Embodiment

In the above-described embodiment, it has been described that the unit time for acquiring the spark information is set, but it is also possible to set and change the entire time span of the trend map displayed on the display unit 104.

Figure 13:
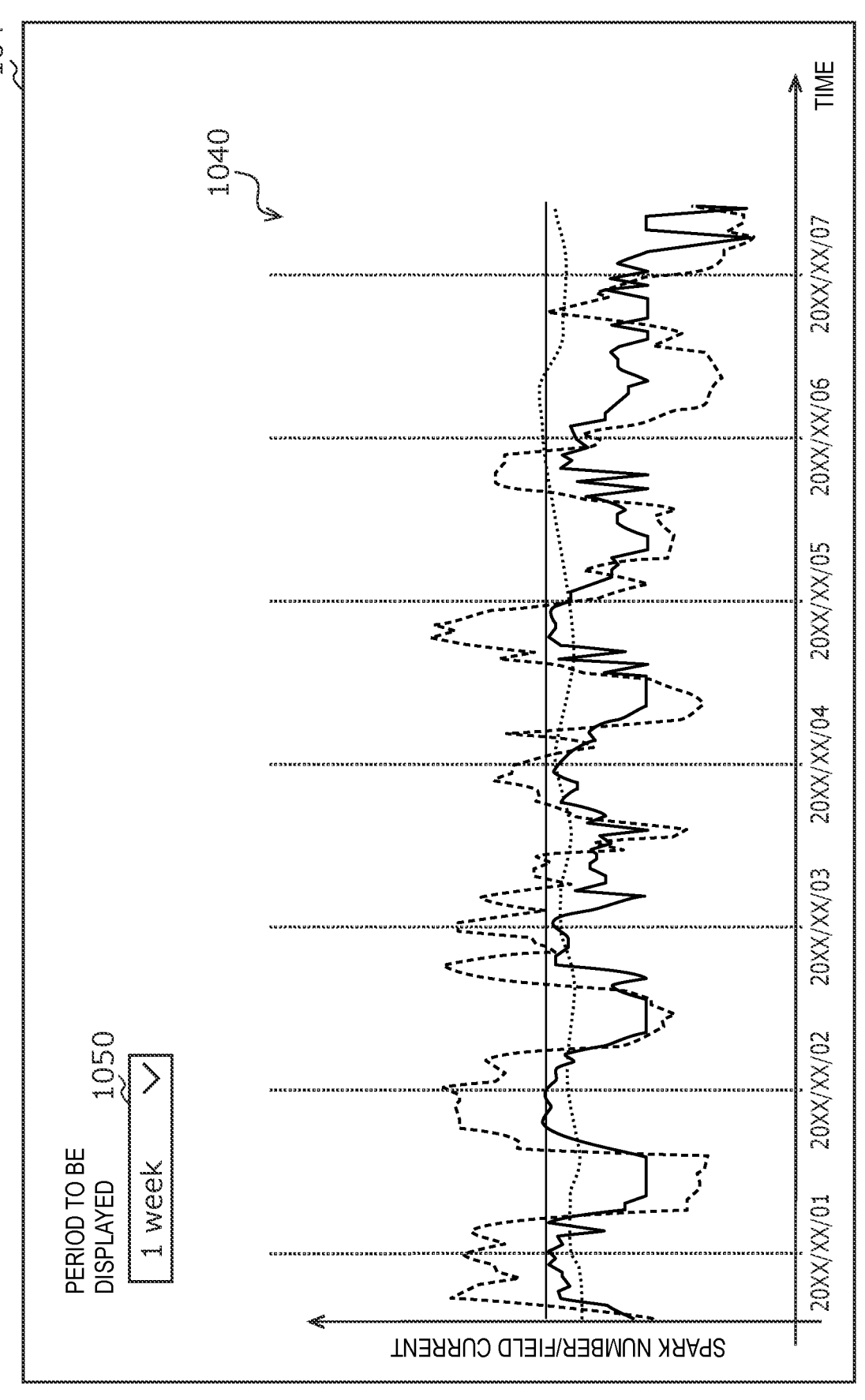

FIG. 13 is a diagram illustrating an example of display on the display unit 104 according to an embodiment. A time span setting area 1050 for setting a display period may be arranged in the display unit 104. The user can change the period of time span setting area 1050 via the input unit.

Figure 14:
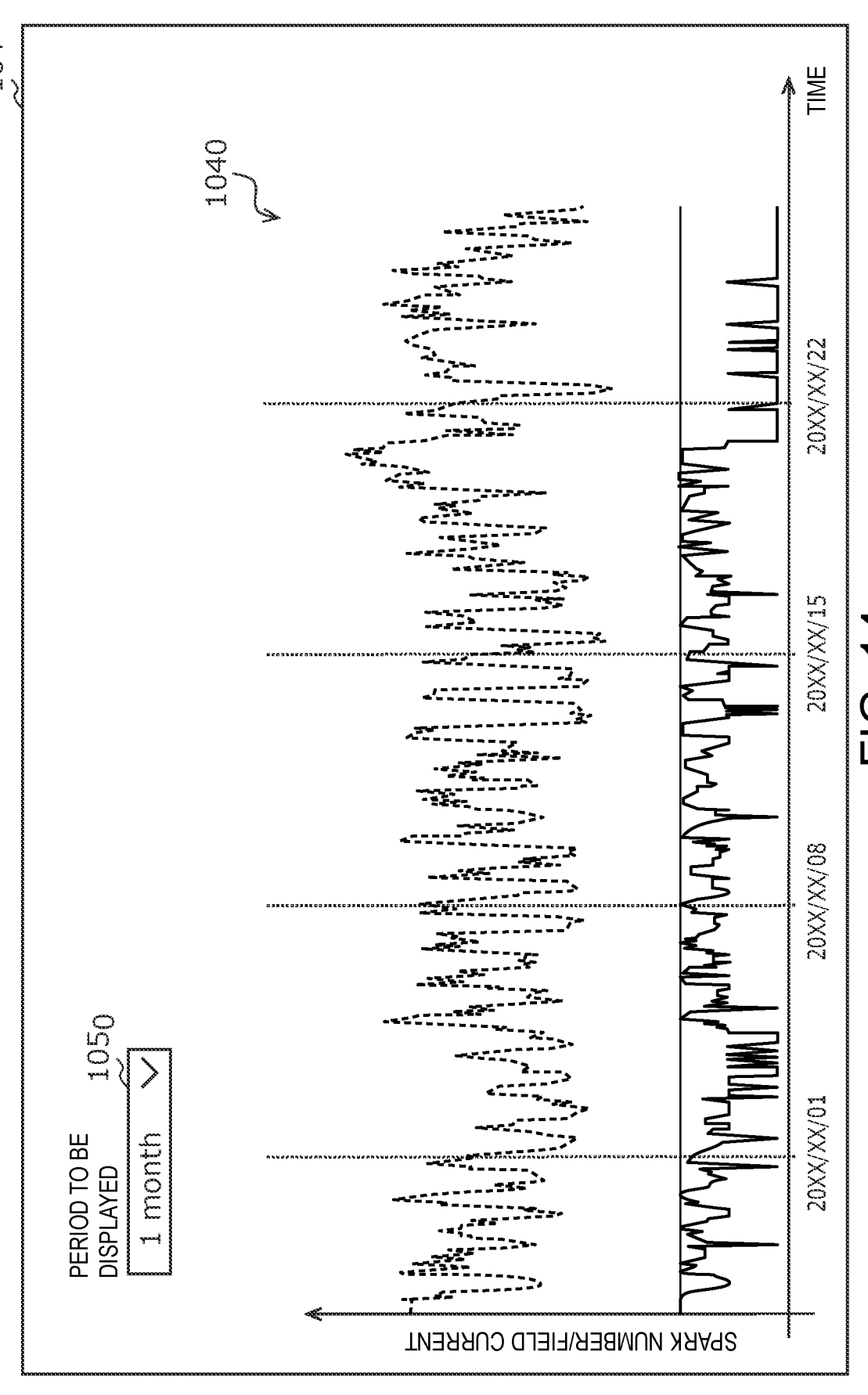

FIG. 14 is a diagram illustrating an example of display on the display unit 104 according to an embodiment. The time span of FIG. 13 is changed from 1 week to 1 month. In this way, by changing the time span, it is possible to view the temporal change of the spark number in a longer period or a shorter period.

In addition, the present invention is not limited thereto, and a form in which a past period is designated and display can be performed in an arbitrary time span may be used.

Note that a graphical user interface (GUI) related to the display unit 104 may be combined with the form of the display unit 104 in each of the above-described embodiments. The same applies to the embodiments described below.

Eighth Embodiment

The monitoring device 10 may have a function of detecting a failure of the spark detection device 20.

Figure 15:
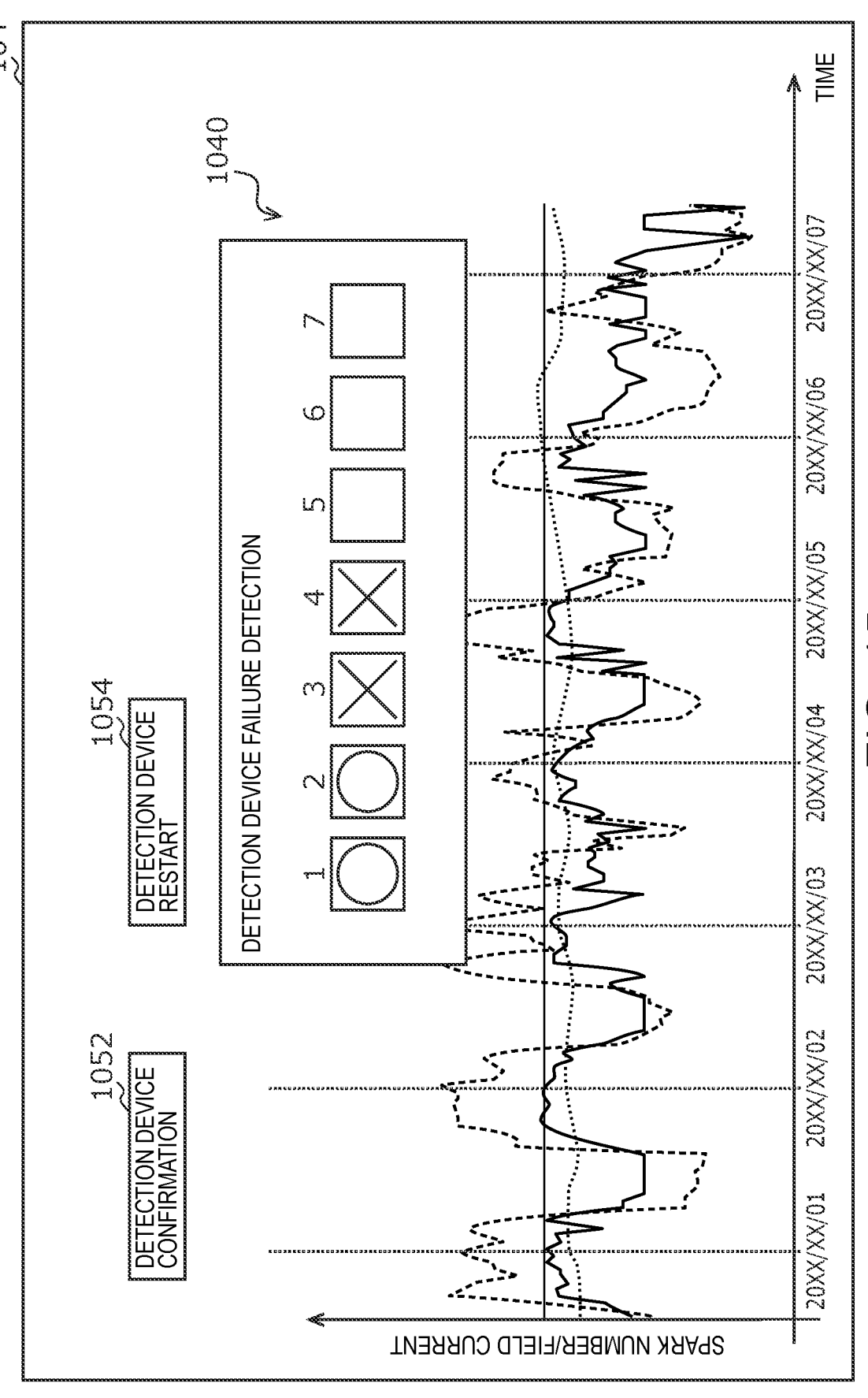

FIG. 15 is a diagram illustrating an example of display on the display unit 104 according to an embodiment. A detection device confirmation button 1052 and a detection device restart button 1054 may be arranged on the display unit 104.

When the detection device confirmation button 1052 is pressed, the control unit 102 can display the failure detection result of the detection device on the display unit 104. In the example of FIG. 15, the monitoring device 10 is connected to four spark detection devices 20, and it is indicated that the first and second devices operate normally and abnormality occurs in the third and fourth devices.

For example, when the information is no longer transmitted, the control unit 102 can determine that a failure has occurred in the spark detection device 20 to which the information is not transmitted. The display of normality or abnormality may be indicated by the color of the box or the like.

When the detection device restart button 1054 is pressed in this state, the control unit 102 transmits a restart request to the connected spark detection device 20. As another example, the control unit 102 may transmit a restart request to the spark detection device 20 determined to be failed.

The spark detection device 20 executes restart based on a request from the control unit 102. The spark detection device 20 is determined as a failure, for example, when the spark detection device performs an abnormal operation such as a physical failure or a software freeze. In such a case, the monitoring device 10 can request the spark detection device 20 to restart. In a case where the spark detection device 20 does not return to the normal state in response to the restart request, the user can determine that the spark detection device has physically failed, or can determine that there is a possibility that another abnormality such as disconnection of a network or the like has occurred.

Ninth Embodiment

The monitoring device 10 may be connected to the Internet. That is, the operation of the spark discharge monitoring system 1 may be acquired from the outside via the Internet.

The monitoring screen of the display unit 104 can also be monitored from a remotely provided terminal. Furthermore, the trend map being viewed may be downloaded in an arbitrary format, for example, a format such as CSV.

According to the present embodiment, the function of the spark discharge monitoring system 1 can be used from a remote place, and analysis and the like can be realized by downloading data.

Tenth Embodiment

Figure 16:
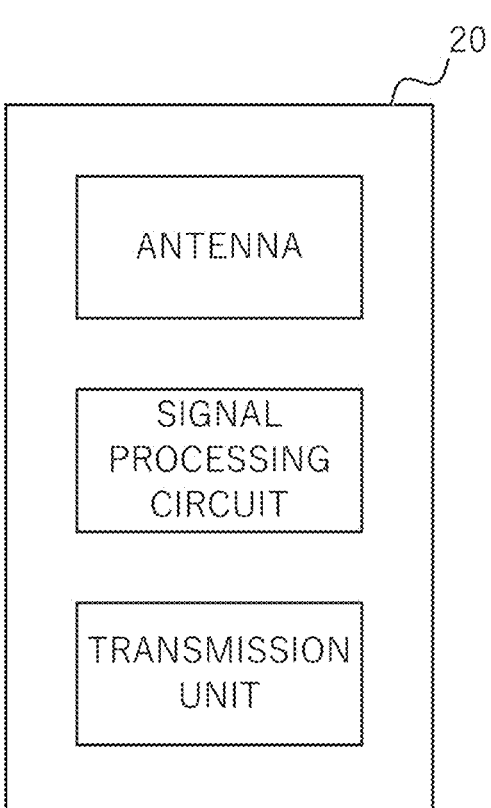
FIG. 16 is a block diagram schematically illustrating an example of a spark detection device according to an embodiment.

FIG. 16 is a block diagram schematically illustrating an example of the spark detection device 20 according to an embodiment. The spark detection device 20 may be disposed separately from the spark discharge monitoring system 1 as described above. The spark detection device 20 includes, for example, a spark discharge detection antenna, a signal processing circuit, and a transmission unit.

The spark discharge detection antenna may have a shape of an antenna for receiving a spark in a non-contact manner which is generally used.

When the spark discharge detection antenna receives a spark, a signal is transmitted to the signal processing circuit. The signal processing circuit includes, for example, a waveform expansion circuit that expands a received signal in a time direction. The waveform expansion circuit may be formed as a circuit capable of appropriately separating sparks without excessively deleting a signal indicating a high-frequency spark unlike a so-called low-pass filter or the like by expanding a waveform in a time direction.

The signal processing circuit may further include an oscilloscope. By inputting the output from the waveform expansion circuit to the oscilloscope, a waveform indicating the pulse of the spark can be acquired. The oscilloscope acquires, for example, time-series data of the intensity of a signal that detects a spark. The signal for detecting a spark is a signal in which the intensity of the signal (current) increases when the antenna receives a spark, and the signal (current) has a substantially constant value in a state where the antenna does not receive a spark.

The transmission unit may transmit the waveform acquired by the oscilloscope to the monitoring device 10. Further, the spark number may be acquired in the signal processing circuit, and the transmission unit may transmit information including at least the spark number to the monitoring device 10. As a non-limiting example, the signal processing circuit may calculate the spark number based on a pulse indicating a spark and the occurrence frequency of the spark.

The signal processing circuit can acquire the spark number by the following formula as an example.

$$(\text{Spark number}) = \sqrt{\frac{(\text{Count number exceeding threshold})}{(\text{Predetermined coefficient})} + 1} \quad (4)$$

The count number exceeding the threshold is, for example, the number of points exceeding the fifth threshold in the signal converted by the oscilloscope. The predetermined coefficient is, for example, the count number in a case where the spark number is two. The point is set by, for example, the granularity in the time direction of the data acquired by the oscilloscope. That is, the signal processing circuit can calculate the spark number not only from the number of pulses but also including information on the pulse width.

For example, when the predetermined coefficient is 24 and the count number exceeding the fifth threshold is 96, it is possible to calculate that the spark has a spark number of 3.00. By providing the threshold in this manner, it is possible to acquire the spark number at which the influence of noise that can occur from various factors in the circuit is suppressed.

In this case, the control unit 102 may display, on the display unit 104, the time from when the spark number becomes the first threshold within the predetermined time until when the spark number becomes less than the first threshold. This makes it possible to determine whether the spark discharge is generated singly or continuously.

As described above, the monitoring device 10 according to the present disclosure can receive spark information from the spark detection device 20 that detects a spark with a non-contact antenna. The monitoring device 10 may simply acquire a signal indicating a spark acquired by the non-contact antenna of the spark detection device 20 as the spark information, may acquire a signal whose waveform is expanded in the spark detection device 20 as the spark information, may acquire a signal deformed by the oscilloscope as the spark information, or may acquire the spark number analyzed in the spark detection device 20 as the spark information.

In addition, as described in the above-described embodiment, the value of the spark number calculated using the above formula (4) is affected by the temperature and humidity of the collector chamber in which the spark discharge detection device is installed. As shown in formula (3), the spark number calculation formula may be corrected by incorporating temperature or humidity information, or a predetermined coefficient of formula (4) may be changed from the temperature or humidity information. In this case, the spark detection device 20 may include a sensor that measures temperature and/or humidity. That is, the spark detection device 20 or the control unit 102 can correct the spark number by the first correction coefficient.

In addition, the distance between the spark detection antenna and the collector ring 30 is determined depending on the place where the spark detection device 20 is installed. The calculation formula of the spark number may be determined by the second correction coefficient based on this distance. For example, the closer the distance between the spark detection antenna of the spark detection device 20 and the collector ring 30, the stronger the intensity of the spark discharge electromagnetic wave received when a spark is generated, and the farther the distance, the weaker the intensity.

Therefore, even in the same spark discharge, the determination result of the spark number may change depending on the distance. In order to avoid this situation, in a case where the spark number is calculated in the spark detection device 20, it is desirable to set the second correction coefficient based on this distance information.

In a case where the spark detection device 20 transmits the intensity of the signal as the spark information to the monitoring device 10, the spark number can be corrected in the monitoring device 10 using a calculation formula similar to formula (3) in which the second correction coefficient based on the distance information is set.

Note that, the spark detection device 20 may have a function of generating and displaying a trend map in a stand-alone manner. That is, the spark detection device 20 may generate a graph of the temporal change related to the spark number, and the spark detection device 20 may construct an environment in which this information can be viewed. As described above, not the spark discharge monitoring system 1 but the spark detection device 20 can directly generate and display the trend map. Of course, the generated trend map may be transmitted to the monitoring device 10.

Furthermore, in the above case, the spark detection device 20 may correspond to a remote environment such as a remote desktop, and an environment in which remote access control for the spark detection device 20 can be performed from the terminal (client) on the user side or the server side may be constructed.

Eleventh Embodiment

In each of the above-described embodiments, the spark discharge monitoring system 1 has focused on monitoring the spark discharge. The spark discharge monitoring system 1 in the present disclosure is not limited thereto, and can further transmit a control request to the generator according to the situation.

The control unit 102 may perform control to lower the operation output of the generator when the spark number is equal to or larger than the sixth threshold. As described above, there is a correlation between the field current of the generator and the spark number. When the spark number increases, for example, when the number is five or more, it can be determined as a harmful spark, so that it is desirable to perform maintenance of the collector ring and the brush.

However, it may be difficult to perform maintenance immediately. In such a case, the generation of sparks can be suppressed by lowering the operation output of the generator.

When the spark number is equal to or larger than the sixth threshold, the control unit 102 may transmit a control request for at least one of an air conditioner or a humidifier in a collector chamber of the generator in which the collector ring is installed.

Although the generation of sparks can be suppressed by performing control to lower the operation output of the generator as described above, it may be difficult to suppress the output depending on the supply and demand situation of power. In such a case, as an example, the generation of sparks can be suppressed by increasing the humidity of the collector chamber.

SUPPLEMENTARY NOTE

The spark discharge monitoring system 1 in the present disclosure can have the following forms described in the above embodiments in addition to the forms described in the claims.

A spark discharge monitoring system, in which the control unit displays the at least one type of operation data (for example, field current) together with the spark number in a superimposed manner, or displays the operation data in an area different from a temporal change of the spark number of the display unit.

The spark discharge monitoring system, in which the control unit calculates a slope of a graph obtained by dividing the spark number by the operation output, and displays the slope of this graph.

The spark discharge monitoring system, in which the control unit displays failure information of the spark discharge detection device on a display unit based on temperature information or failure information of the spark discharge detection device included in the spark information.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spark discharge monitoring system, comprising:
   a receiving unit;
   a control unit; and
   a display unit,
   wherein:
   the receiving unit receives spark information on a spark caused by sliding between a collector ring and a brush, the spark being detected by a spark detection device based on a current generated by the spark, and
   the control unit:
      acquires a temporal change of a spark number based on the spark information,
      corrects the spark number based on operation data including at least data on a detected field current associated with generation of sparks, and
      displays the temporal change of the corrected spark number on the display unit.

2. The spark discharge monitoring system according to claim 1, further comprising:
   an input unit,
   wherein the control unit:
      displays a reset button on the display unit,
      displays an alarm on the display unit when the spark number is equal to or larger than a first threshold, and
      cancels the alarm displayed on the display unit when receiving an input to the reset button via the input unit in a state where the alarm is displayed.

3. The spark discharge monitoring system according to claim 1, wherein the control unit:
   displays first information on the display unit when the spark number is less than a first threshold, and
   displays second information on the display unit when the spark number is equal to or larger than the first threshold.

4. The spark discharge monitoring system according to claim 1, wherein the control unit:
   displays first information on the display unit when the spark number is less than a second threshold,
   displays third information on the display unit when the spark number is equal to or larger than the second threshold and less than a third threshold larger than the second threshold, and
   displays second information on the display unit when the spark number is equal to or larger than the third threshold.

5. The spark discharge monitoring system according to claim 2, wherein the control unit sets the first threshold based on the information received via the input unit.

6. The spark discharge monitoring system according to claim 1, wherein the control unit:

calculates a plurality of the spark numbers based on a plurality of pieces of the spark information received at a same timing, extracts a maximum value from the plurality of the spark numbers, and displays a temporal change of the extracted maximum value on the display unit.

7. The spark discharge monitoring system according to claim 4, wherein the control unit displays the second information and the third information on the display unit when the spark number is equal to or larger than the second threshold and a number of continuous occurrences of the spark number exceeds a fourth threshold.

8. The spark discharge monitoring system according to claim 1, wherein the control unit changes and displays a time span of a temporal change on the display unit.

9. The spark discharge monitoring system according to claim 1, wherein the spark detection device comprises:

an antenna configured to detect spark discharge; and a transmission unit configured to transmit the spark information to the receiving unit.

10. The spark discharge monitoring system according to claim 9, wherein:

the spark detection device further comprises a signal processing unit, and the signal processing unit:

acquires a count number at which an intensity of discharge exceeds a fifth threshold among the detected spark discharges, calculates the spark number based on the count number exceeding the fifth threshold, and transmits the spark number as the spark information to the receiving unit.

11. The spark discharge monitoring system according to claim 9, wherein:

the spark detection device further comprises a signal processing unit, and the signal processing unit calculates the spark number by a calculation formula including a second correction coefficient based on a distance to a spark generation place.

12. The spark discharge monitoring system according to claim 9, wherein:

the spark detection device further comprises a signal processing unit, and the signal processing unit calculates the spark number by a calculation formula including a first correction coefficient based on at least one of temperature information or humidity information.

13. The spark discharge monitoring system according to claim 1, wherein the control unit calculates the spark number by a calculation formula including a first correction coefficient based on at least one of temperature information or humidity information of the spark detection device that has transmitted the spark information.

14. The spark discharge monitoring system according to claim 1, wherein the control unit calculates the spark number by the spark detection device that has transmitted the spark information and a calculation formula including a second correction coefficient based on a distance to a spark generation place.

15. The spark discharge monitoring system according to claim 1, wherein the control unit performs control to lower an operation output of a generator when the spark number is equal to or larger than a sixth threshold.

16. The spark discharge monitoring system according to claim 1, wherein the control unit controls at least one of an air conditioner or a humidifier in a generator collector chamber when the spark number is equal to or larger than a sixth threshold.

17. The spark discharge monitoring system according to claim 1, wherein the control unit corrects the spark number to be smaller as the field current increases.

18. The spark discharge monitoring system according to claim 1, wherein the control unit:

predicts a temporal change of a future field current and a temporal change of a future spark number based on operation plan data, the operation plan data including data related to plans of future operation of the collector ring and the brush for power generation, and displays the temporal change of the future field current and the temporal change of the future spark number on the display unit.

19. The spark discharge monitoring system according to claim 1, wherein the control unit issues an alarm when the corrected spark number deviates from the spark number to such an extent that a difference from a predetermined value is larger than a predetermined deviation value.

20. A spark discharge monitoring system, comprising:

a receiving unit;

a control unit; and a display unit, wherein:

the receiving unit receives spark information on a spark caused by sliding between a collector ring and a brush, the spark being detected by a spark detection device based on a current generated by the spark, and the control unit:

acquires a temporal change of a spark number based on the spark information, predicts a future spark number based on operation plan data, the operation plan data including data related to plans of future operation of the collector ring and the brush for power generation, and displays at least the temporal change of the future spark number on the display unit.

* * * * *